(12) United States Patent
Kim et al.

(10) Patent No.: US 8,664,852 B2
(45) Date of Patent: Mar. 4, 2014

(54) ORGANIC LIGHT EMITTING DISPLAY DEVICE AND METHOD FOR MANUFACTURING THE SAME

(75) Inventors: Jong-Sung Kim, Paju-si (KR); Ho-Jin Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/490,201

(22) Filed: Jun. 6, 2012

(65) Prior Publication Data

US 2012/0313516 A1    Dec. 13, 2012

(30) Foreign Application Priority Data

Jun. 10, 2011  (KR) .......................... 10-2011-0056347

(51) Int. Cl.
*H01L 51/50* (2006.01)
*H01L 51/52* (2006.01)
*H01L 51/56* (2006.01)

(52) U.S. Cl.
USPC ............. 313/512; 313/509; 313/506; 445/24; 445/25

(58) Field of Classification Search
USPC ................. 313/500–512; 445/24, 25
See application file for complete search history.

(56) References Cited

U.S. PATENT DOCUMENTS 8,169,132 B2 *  5/2012  Oh et al. ........................ 313/512

* cited by examiner

*Primary Examiner* — Mariceli Santiago
(74) *Attorney, Agent, or Firm* — Fenwick & West LLP

(57) ABSTRACT

Present invention is for an organic light emitting display device in which permeation of exterior moisture can be prevented, dark defects caused by foreign materials can be improved and lifespan can thus be improved by changing the structure and manufacturing method of thin film encapsulation layer, and a method for manufacturing the same, the organic light emitting display device includes the edge region of the thin film encapsulation layer is thicker than the active region thereof and the thin film encapsulation layer includes a plurality of organic film and a plurality of inorganic film, the organic film and the inorganic film being laminated one on top of the other.

14 Claims, 6 Drawing Sheets

Foreign material produced in deposition mask

Lateral moisture permeation due to foreign material

Edge region of Screen Mask

ORGANIC LIGHT EMITTING DISPLAY DEVICE AND METHOD FOR MANUFACTURING THE SAME

CROSS-REFERENCE TO RELATED APPLICATIONS

This application claims priority under 35 U.S.C. 119(a) from Korean Patent Application No. 10-2011-0056347, filed on Jun. 10, 2011, which is hereby incorporated by reference in its entirety.

BACKGROUND OF THE INVENTION

1. Field of the Invention

The present invention relates to an organic light emitting display device. More specifically, the present invention relates to an organic light emitting display device in which permeation of exterior moisture can be prevented, dark defects caused by foreign materials can be improved and lifespan can thus be improved by changing the structure and manufacturing method of thin film encapsulation layer, and a method for manufacturing the same.

2. Discussion of the Related Art

Image display devices that realize a variety of information on the screen are core techniques of the information and telecommunication age, which are developed into thinner, lighter weight, portable and high-performance forms. In addition, bendable and flexible displays are required in pursuit of spatiality and convenience, and organic light emitting display devices to control an emitted light amount of an organic light emitting layer as display devices attract much attention recently.

Such an organic light emitting display device includes an organic light emitting element which includes an anode, an organic light emitting layer and a cathode laminated in this order on a substrate and a capping layer to cap the organic light emitting element.

The organic light emitting element is operated based on the following principle. That is, when an electric field is applied to a cathode and an anode disposed on both ends of the organic light emitting layer, electrons and holes injected and transported in the organic light emitting layer are recombined. The organic light emitting element uses electroluminiscence in which light is emitted by a bonding energy during this recombination. Electrons and holes are paired in the organic light emitting layer and then fall from an excited state to a bottom state to emit light.

In addition, the organic light emitting display device can be advantageously realized as a thin film. However, the organic light emitting display device has disadvantages in that deterioration due to internal factors such as deterioration of electrodes and light emitting layers due to oxygen and deterioration due to reaction between the light emitting layer and the interface, and deterioration due to exterior factors such as moisture, oxygen and UV light readily occur. Accordingly, it is considerably important to package and encapsulate the organic light emitting display device.

Hereinafter, the problems of an organic light emitting display device of the related art to which encapsulation is applied will be described.

FIG. 1 is a view illustrating the effect of foreign materials on an organic light emitting display device of the related art.

As shown in FIG. 1, an organic light emitting display device of the related art includes a substrate 10, an organic light emitting element array 20 disposed thereon and an encapsulation layer 30 including an inorganic film and an organic film laminated in this order, to protect the organic light emitting element array 20. Here, the encapsulation layer 30 has a substantially uniform thickness in a region in which the organic light emitting element array 20 is formed and display is substantially realized or at the edge of the region. Otherwise, the thickness of the encapsulation layer 30 may decrease at the edge due to properties of film formation.

Here, non-described reference numeral "21" means a bank to divide respective pixels of an organic light emitting element array and define respective light emitting layer formation regions.

When, during formation of the encapsulation layer 30, a foreign material 40 is present at the edge of the substrate 10, moisture permeation in which moisture is permeated along the foreign material 40, or an outgassing phenomenon in which gas generated in the foreign material 40 directly affects operation of the organic light emitting element array 20 may occur.

Meanwhile, in a case in which the encapsulation layer 30 is thickly formed, in order to reduce effects of the foreign material 40, disadvantageously, the thickness of the manufactured organic light emitting display device is increased, manufacturing costs increase and yield is deteriorated. In particular, the organic light emitting element array 20 also causes a secondary problem such as decrease in luminance due to large thickness. Accordingly, simple increase in thickness of the encapsulation layer 30 is limited. The method for manufacturing an organic light emitting display device of the related art cannot avoid effects of moisture permeation by foreign material or outgassing.

FIGS. 2A and 2B are images illustrating a foreign material produced at the edge of a deposition mask and moisture permeation of the side of the organic light emitting display device manufactured using the deposition mask.

FIG. 2A illustrates an edge of a deposition mask used for forming an encapsulation layer and, in particular, a state in which a foreign material is produced on the edge which contacts the substrate. FIG. 2B illustrates a state in which, when the deposition mask of FIG. 2A is used, moisture permeation of the side surface is caused by the foreign material and dark spots of elements adjacent to the edge of the organic light emitting display device are produced. As can be seen from these images, in the edge of the organic light emitting display devices, effects of the foreign material are serious.

The organic light emitting display device of the related art has the following problems.

In the process of forming the encapsulation layer, a great amount of foreign materials are produced in the edge of a deposition mask which directly contacts the substrate. For this reason, foreign materials are generally produced on the edge of the substrate.

Once a foreign material is present on the substrate, permeation of moisture in which moisture is permeated through the foreign material, or an outgassing phenomenon in which a gas generated in the foreign material directly affects operation of the organic light emitting element array may occur, unless the foreign material is completely covered via encapsulation.

However, an increase in thickness of the encapsulation layer in order to reduce effects of the foreign material entails restriction due to deterioration in yield and luminance. There is a difficulty in forming an encapsulation layer which has a sufficient thickness to block foreign materials.

SUMMARY OF THE INVENTION

Accordingly, the present invention is directed to an organic light emitting display device and a method for manufacturing the same that substantially obviate one or more problems due to limitations and disadvantages of the related art.

It is one object of the present invention to provide an organic light emitting display device in which permeation of moisture can be prevented, dark defects caused by foreign materials can be improved and lifespan can thus be improved by changing the structure and manufacturing method of thin film encapsulation layer, and a method for manufacturing the same.

In accordance with one aspect of the present invention, provided is an organic light emitting display device including: a substrate in which an active region and an edge region are defined; an organic light emitting element array formed in the active region; and a thin film encapsulation layer to cover the organic light emitting element array, wherein the edge region of the thin film encapsulation layer is thicker than the active region thereof and the thin film encapsulation layer includes a plurality of inorganic films and a plurality of organic films, the organic film and the inorganic film being laminated one on top of the other.

The thin film encapsulation layer may be flatly formed in the active region.

Among inorganic films and organic films of the thin film encapsulation layer, only the organic films may be formed such that the edge region is thicker than the active region.

The diameter of the thicker region of the organic film may be 10 µm to 5000 µm.

The edge region of the thin film encapsulation layer may have a thickness 1.2 to 2 times higher than the active region thereof.

The lowermost and uppermost layers of the thin film encapsulation layer may be inorganic films.

The mesh edge of the screen mask for forming the organic films of the thin film encapsulation layer may be corresponding to the thicker area of the thin film encapsulation layer of the edge region.

In accordance with another aspect of the present invention, provided is a method for manufacturing an organic light emitting display device including: preparing a substrate in which an active region and an edge region are defined; forming an organic light emitting element array in the active region; and forming a thin film encapsulation layer a plurality of organic film and a plurality of inorganic film one on top of the other, wherein the thin film encapsulation layer covers the organic light emitting element array and the edge region of the thin film encapsulation layer is thicker than the active region thereof.

In the step of forming the thin film encapsulation layer, the organic film of the thin film encapsulation layer may be formed by screen printing using a screen mask having a mesh corresponding to the edge region.

The mesh edge of the screen mask may correspond to the thicker edge region of the thin film encapsulation layer.

In the step of forming the thin film encapsulation layer, the screen mask may be used for formation of all organic films of the thin film encapsulation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to the specific embodiments of the present invention, examples of which are illustrated in the accompanying drawings.

Figure 1:
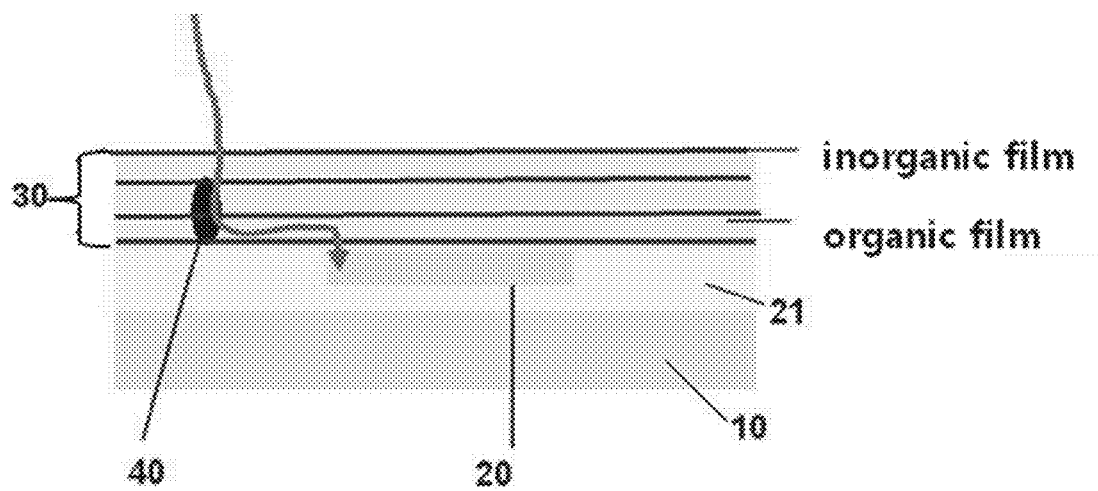
FIG. 1 is a view illustrating effects of foreign materials on an organic light emitting display device.
Figure 2A:
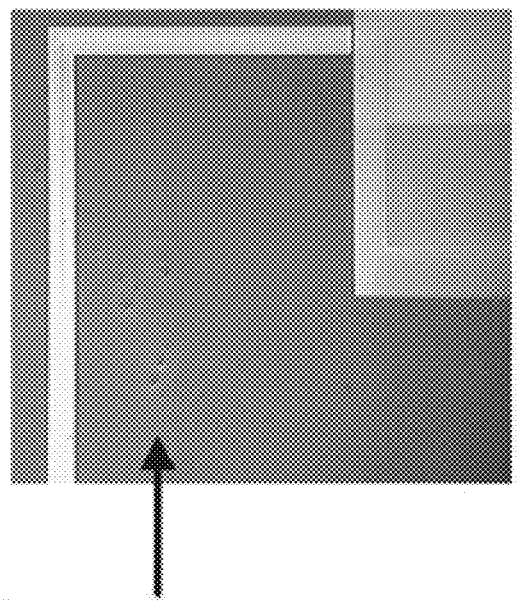
FIGS. 2A and 2B are images showing a foreign material generated in the edge of a deposition mask and a lateral moisture permeation of the organic light emitting display device manufactured using the same.
Figure 2B:
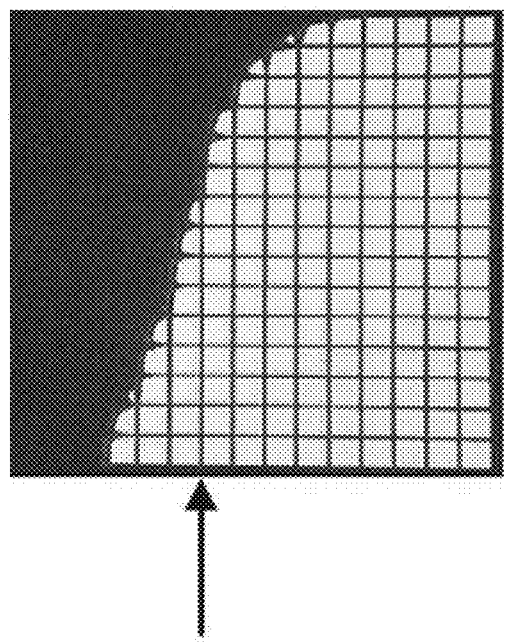
Figure 3:
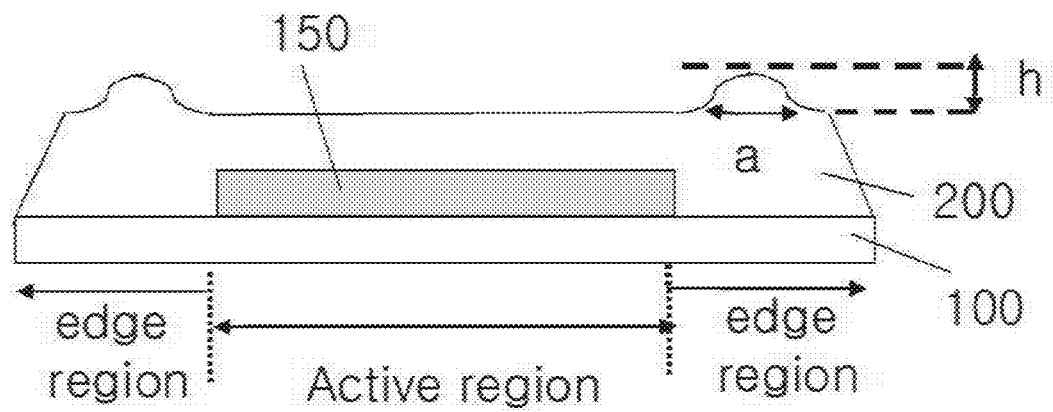
FIG. 3 is a schematic sectional view illustrating an organic light emitting display device according to the present invention.

FIG. 3 is a schematic sectional view illustrating an organic light emitting display device according to the present invention.

As shown in FIG. 3, the organic light emitting display device of the present invention includes a substrate 100 to define an active region and an edge region, an organic light emitting element array 150 disposed in the active region and a thin film encapsulation layer 200 which covers the organic light emitting element array 150 to protect the organic light emitting element array 150 from the air or moisture of the outside, wherein the edge region of the thin film encapsulation layer 200 is thicker than the active region thereof.

In particular, the reason for forming the thin film encapsulation layer 200 such that the edge region is thicker than the active region is that, although the foreign material is present in the edge region during the thin film encapsulation process, since the edge region is particularly vulnerable to foreign materials, the thick film can cover the foreign material. That is, when the foreign material is produced, the upper and lower surfaces of the thick thin film encapsulation layer 200 cover the foreign material and prevent permeation of the air or moisture from an outside and outgassing induced by the foreign material.

Here, the thin film encapsulation layer 200 includes a plurality of inorganic films and a plurality of organic films which are alternately laminated. In particular, the inorganic film serves as a barrier layer to block foreign materials or the like, and the organic film serves as a decoupling layer to reduce stress generated by use of an inorganic film.

The uppermost and lowermost layers of the thin film encapsulation layer 200 are inorganic films.

This aims to prevent direct permeation of moisture and air into the organic light emitting element array 150.

Meanwhile, the diameter (a) of a thick area in the edge region is about 10 µm to about 5,000 µm. The height (h) of the protrusion of the thick area in the edge region is about 0.2 times to about equal to the thickness of the remaining flat region. The total thickness of the thick area corresponds to about 1.2 to 2 times the thickness of the remaining flat region.

However, these values are provided only as an example. The difference in thickness between the active region and the edge region may be varied depending on efficiency of luminance and generated foreign material level of the organic light emitting display device.

Hereinafter, a configuration of the thin film encapsulation layer 200 will be described in detail.

Figure 4:
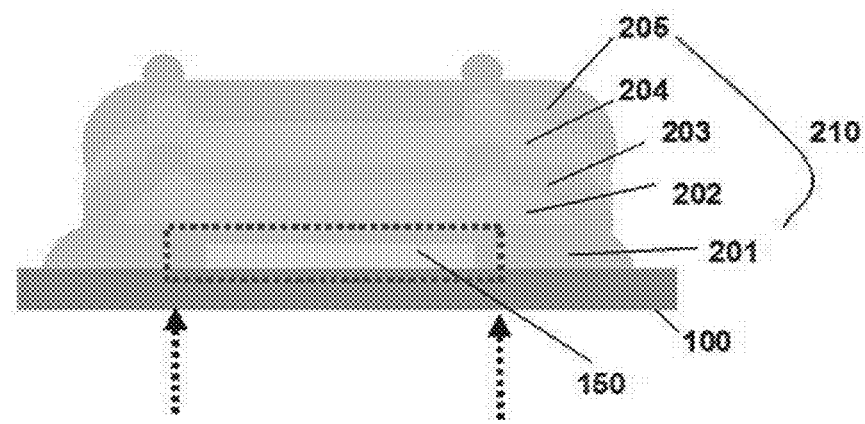
FIG. 4 is a sectional view illustrating an organic light emitting display device according to one embodiment of the present invention.

FIG. 4 is a sectional view illustrating an organic light emitting display device according to one embodiment of the present invention.

As shown in FIG. 4, in the organic light emitting display device according to one embodiment of the present invention, the thin film encapsulation layer 210 including 2.5 pairs (dyads) of inorganic films and organic films is illustrated. FIG. 4 illustrates a state in which a first inorganic film 201, a first organic film 202, a second inorganic film 203, a second organic film 204 and a third organic film 205 which are laminated from the bottom in this order.

As such, the reason for alternately forming the inorganic films and organic films is that, although the organic films may be omitted when the barrier property of the inorganic films is excellent, the inorganic film composed of a thin film can inherently completely remove pin holes in the inorganic film, foreign materials, fragments and the like and organic films are thus formed between the inorganic films in order to reinforce these defects.

Here, only the first organic film 202 and the second organic film 204 in the edge region are thicker than the active region, and the remaining first to third inorganic films 201, 203, and 205 maintain a uniform thickness throughout the overall region. As shown in the drawing, only the second inorganic film 203 and the third organic film 205 in the edge region are disposed along the surface step of the first organic film 202 and the second organic film 204.

In this case, the reason for thickly forming only the first organic film 202 and the second organic film 204, rather than the inorganic film in the edge region is that the organic film can be thickly formed, as compared to the inorganic film and has a superior performance of covering the foreign material. For example, under general conditions, the inorganic film is formed to a thickness of about 0.05 to about 0.3 μm, and the organic film is formed to a thickness of 0.45 to 0.7 μm, and the thickness of the inorganic film is insufficient to cover a foreign material with a thickness of 1 to 3 μm generated in the process of forming organic films and inorganic films constituting the thin film encapsulation layer 210. In particular, to cover the thin film encapsulation layer 210 of the present invention foreign material, the first and second organic films 202 and 204 of the edge region are formed to thicknesses 0.1 to 0.7 μm larger than the active region, thus enabling foreign materials generated in the edge region to be sufficiently covered, not be exposed.

In this case, the aforementioned thickness values of the organic films and the like are provided as an example. The thicknesses of first and second organic films 202 and 204 may be determined depending on the size of foreign material that may be generated in the edge region.

As such, by changing the configuration of the organic film of the thin film encapsulation layer 210, foreign materials are covered to prevent moisture permeation and thereby accurately protect the organic light emitting element array from the air or moisture of the outside. As a result, generation of dark spots is prevented and lifespan can be improved.

Meanwhile, the thin film encapsulation layer 210 is flatly formed in the active region. This aims to prevent a decrease in luminance or deterioration in efficiency of luminance, when the thickness of the active region is increased. In addition, this aims to sufficiently secure flexibility, when the substrate 100 is a flexible material such as a thin film glass, a metal foil or a plastic. In the present invention, a thicker edge region is limited to a partial width of a region of the substrate 100 in which display is not realized and is not a region which greatly affects realization of a flexible display. In addition, the edge region is a region in which display is not realized which does not have an influence on display efficiency such as luminance and is thus free from secondary problems.

The thickness of the thin film encapsulation layer 210 of the active region may be determined to maximize efficiency and color coordinates of the organic light emitting element array.

Meanwhile, a considerably thicker area in the edge region corresponds to a mesh edge of the screen mask to form the organic film of the thin film encapsulation layer 210. In addition, the actual thickness of the organic film in the thicker area of the organic film can be controlled by changing a pressure applied by squeegee using the screen mask in the screen printing process.

Meanwhile, the minimum of inorganic film/organic film pairs (dyads) of the thin film encapsulation layer 210 is determined at 1.5 dyads or higher, and the maximum thereof is determined under the condition that the efficiency of the organic light emitting element array 150 is not deteriorated.

Figure 5:
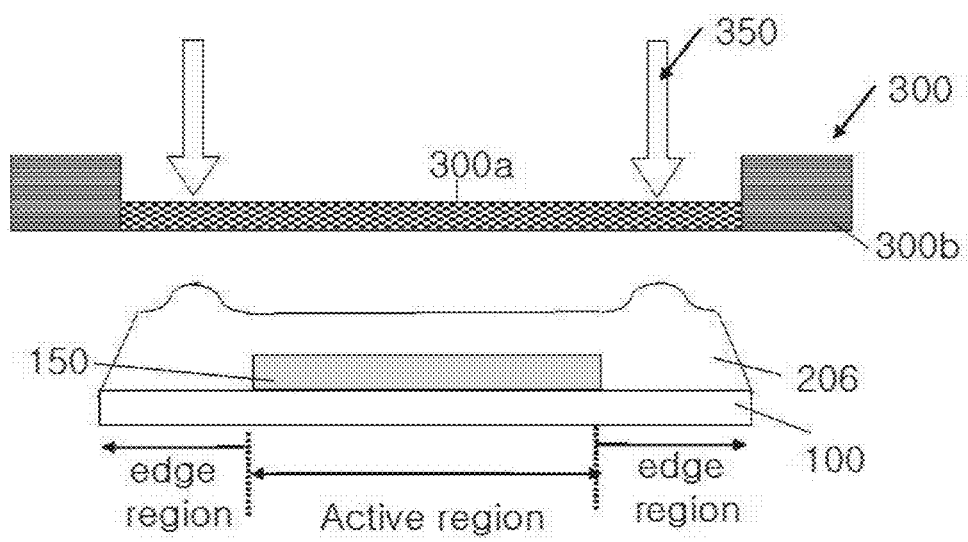
FIG. 5 is a process sectional view illustrating a method for manufacturing an organic layer of a thin film encapsulation layer in the organic light emitting display device of the present invention.
Figure 6:
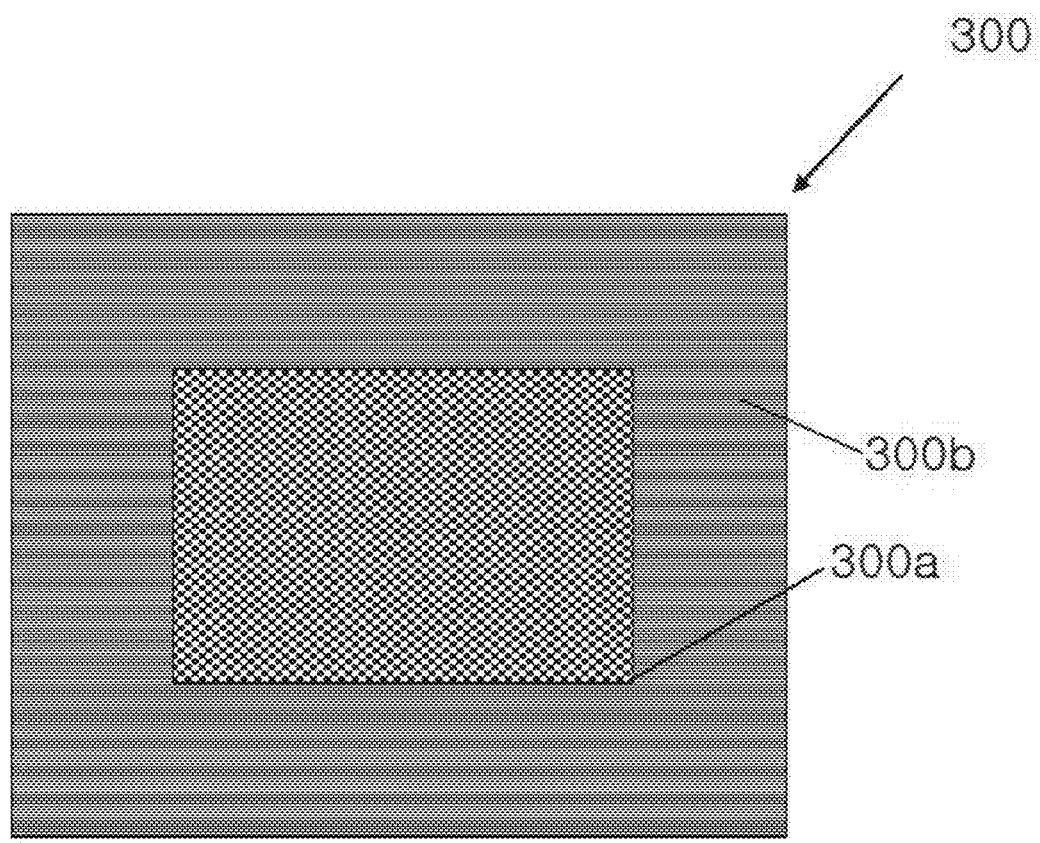
FIG. 6 is a plan view illustrating a screen mask used in FIG. 5.
Figure 7A:
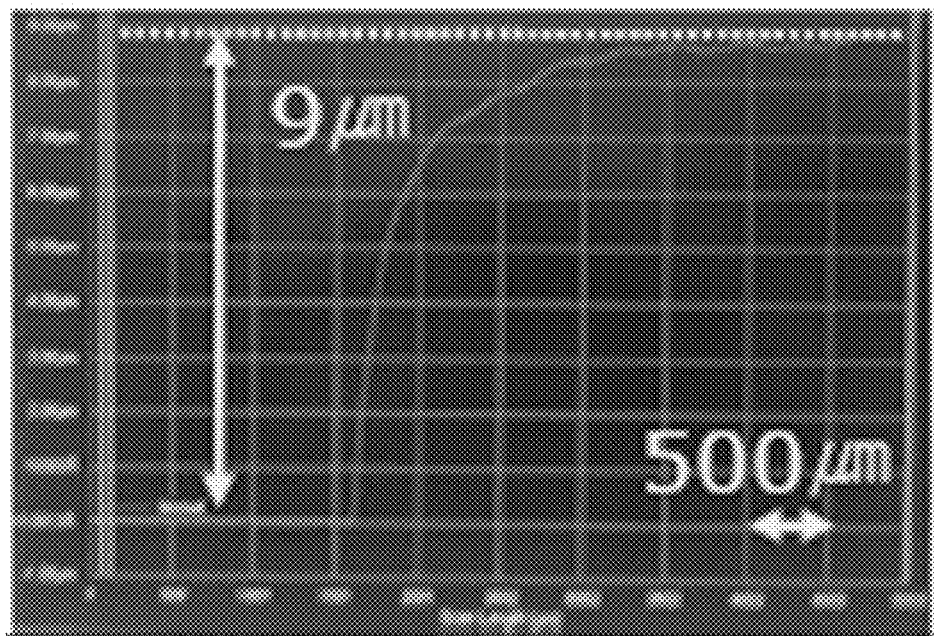
FIGS. 7A to 7D are graphs showing variation in thickness of an organic film around the edge region when the diameter of a screen mask is changed.
Figure 7B:
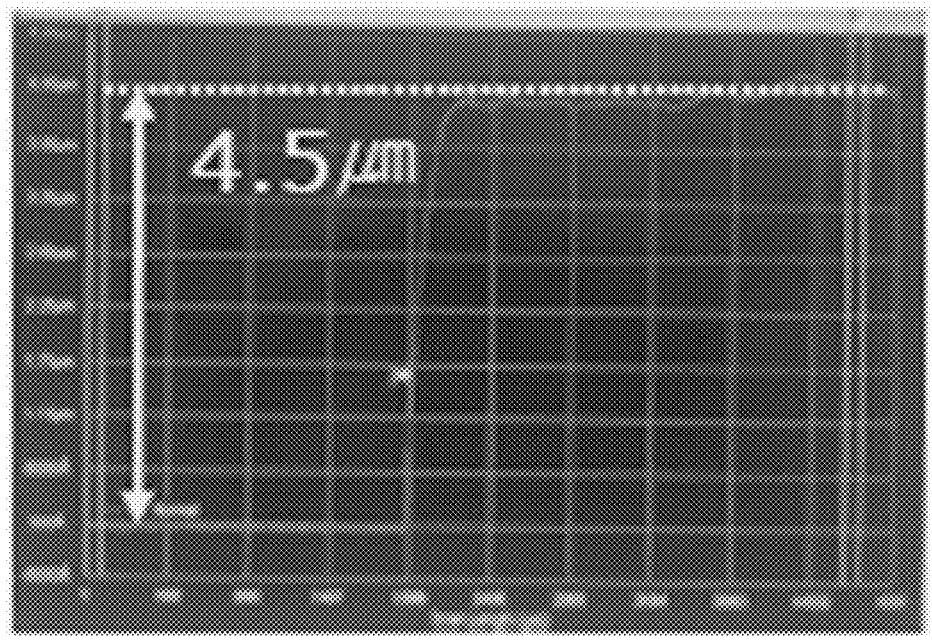
Figure 7C:
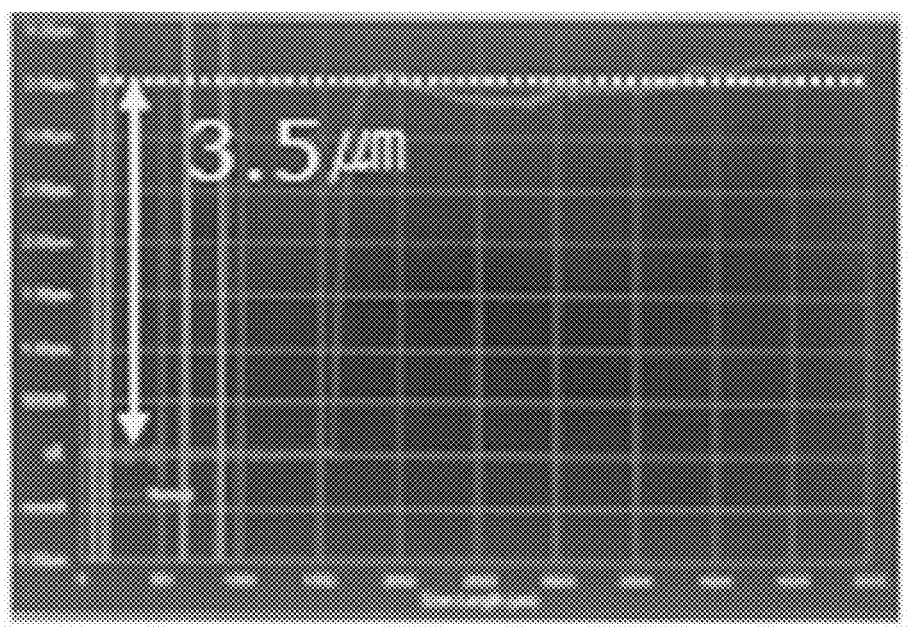
Figure 7D:
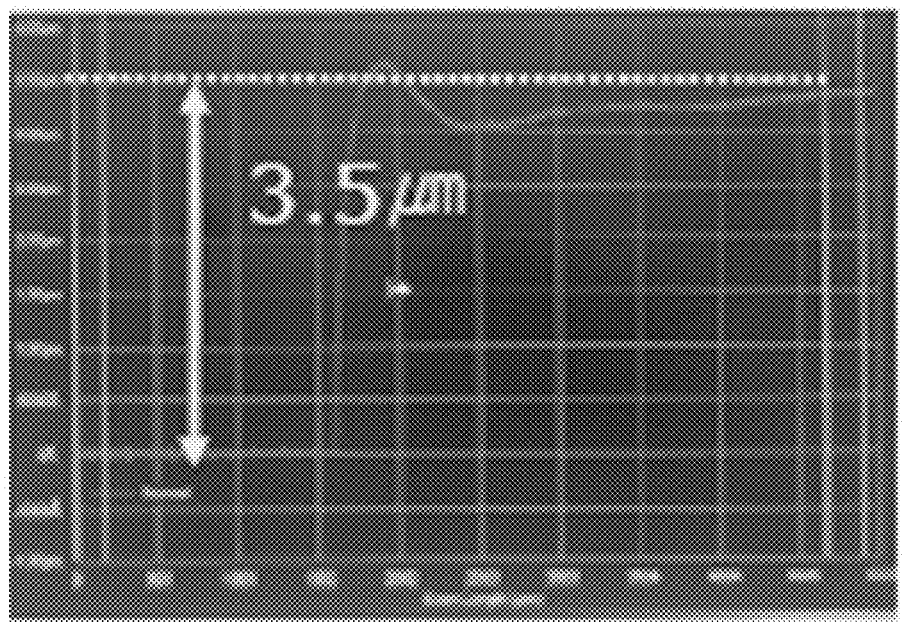

FIG. 5 is a process sectional view illustrating a method for manufacturing an organic layer of a thin film encapsulation layer in the organic light emitting display device of the present invention and FIG. 6 is a plan view illustrating a screen mask used in FIG. 5.

With reference to FIGS. 3, 5 and 6, a method for manufacturing the organic light emitting display device of the present invention will be described.

First, as shown in FIG. 3, a substrate 100, in which an active region and an edge region are defined, is prepared and an organic light emitting element array 150 is then formed in the active region.

Next, a thin film encapsulation layer 200 is formed such that it covers the organic light emitting element array 150 and the edge region is thicker than the active region. The thin film encapsulation layer 200 is formed by alternately laminating a plurality of inorganic films and a plurality of organic films.

As shown in FIG. 5, the organic film 206 of the thin film encapsulation layer is formed in the organic film formation region by screen printing using a screen mask 300 having a mesh 300a. Here, a light-shielding portion 300b composed of a material such as metal is defined in a region except the organic film formation region.

In addition, the edge of the mesh 300a of the screen mask 300 corresponds to the edge region of the substrate 100. In addition, a squeegee 350 to apply pressure so that an organic substance is coated on the substrate 100 through the mesh 300a is used for screen printing using the screen mask 300. In particular, after the organic substance is applied such that the organic substance is thickly applied to the edge region by applying high pressure to the edge region using the squeegee 350 and the active region is flattened, the applied organic substance is cured to form an organic film 206.

Here, the organic substance permeated into the mesh 300a is a liquid monomer, which passes through the mesh 300a and is then applied to the substrate 100, and then cured to cause polymerization and thereby form an organic film 206.

Such a screen printing method enables configuration of equipment at low vacuum and thus reduces equipment cost, as compared to a conventional method in which organic films are formed using a flash vacuum deposition apparatus. In addition, the thickness of edge regions can be controlled by controlling the diameter of the mesh 300a and squeegee pressure.

In addition, the screen mask 300 may be used for formation of all organic films of the thin film encapsulation layer.

FIGS. 7A to 7D are graphs showing variation in thickness of an organic film around the edge region when the diameter of a screen mask is changed.

The graphs of FIGS. 7A to 7D are obtained by measuring the thicknesses of an organic film from an active region to an edge region after screen printing to form each organic film using tetron as the mesh structure of the screen mask.

The thickness of the organic film is measured under the condition that diameters of the mesh structure are 40Φ, 30Φ, 18Φ and 15Φ. It can be seen that the differences in thickness of the active region and the edge region are 9 μm, 4.5 μm, 3.5 μm, and 3.5 μm. This means that as diameter increases, the difference in thickness between the active region and the edge region may be increased. Also, this means that use of the screen mask realizes difference in thickness between the active region and the edge region and, in particular, an organic film in which the edge region is thicker can be formed.

The organic light emitting display device of the present invention and a method for manufacturing the same have the following advantages.

First, in a thin film encapsulation layer structure in which organic films and inorganic films are alternately laminated, the edge region of the organic film to block foreign materials is formed to a thickness greater than that of the active region, to keep the thickness of the light emitting portion in the active region optimum and cover foreign materials in the edge region of the substrate in which the foreign materials are frequently generated, and thereby prevent influences of lateral moisture permeation or an outside air.

Second, the foreign material is blocked and generation of dark spots can thus be prevented by changing the thin film encapsulation layer structure.

Third, a thin film encapsulation layer with a small thickness can be maintained on the organic light emitting element array and a protective film can thus be designed without deterioration in efficiency of luminance. In this case, by determining the thickness of thin film encapsulation layer of the organic light emitting element array under optimum conditions, deterioration in luminance and color coordinates of the organic light emitting element can be prevented.

Fourth, the thickness of the organic film of the only edge region can be increased using a screen printing process. In this case, a process margin of screen printing is great and control of thickness is thus possible. In addition, as compared to a case of the related art in which a vacuum deposition apparatus is used for formation of organic films, screen printing is possible under low vacuum conditions and equipment can be designed at a low cost.

Fifth, ultimately, lifespan can be improved based on the thin film encapsulation layer structure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device having an active region and an edge region, comprising:
   a substrate in which the active region and the edge region are defined;
   an organic light emitting element array formed in the active region; and
   a thin film encapsulation layer to cover the organic light emitting element array, wherein the thin film encapsulation layer is thicker in the edge region than in the active region, and the thin film encapsulation layer includes a plurality of organic films and a plurality of inorganic films, the organic films and the inorganic films being laminated in an alternating manner,
   wherein among the inorganic films and the organic films of the thin film encapsulation layer, only the organic films are formed to be thicker in the edge region than in the active region.

2. The organic light emitting display device according to claim 1, wherein the thin film encapsulation layer is flatly formed in the active region.

3. The organic light emitting display device according to claim 1, wherein a diameter of a thicker region of the organic film in the edge region is 10 μm to 5000 μm.

4. The organic light emitting display device according to claim 2, wherein a thickness of the thin film encapsulation layer in the edge region is 1.2 to 2 times greater than a thickness of the thin film encapsulation layer in the active region.

5. The organic light emitting display device according to claim 1, wherein lowermost and uppermost layers of the thin film encapsulation layer are the inorganic films.

6. The organic light emitting display device according to claim 1, wherein a mesh edge of a screen mask for forming the organic films of the thin film encapsulation layer corresponds to a thicker area of the thin film encapsulation layer of the edge region.

7. A method for manufacturing an organic light emitting display device having an active region and an edge region, the method comprising:
   preparing a substrate in which the active region and the edge region are defined;
   forming an organic light emitting element array in the active region; and
   forming a thin film encapsulation layer by laminating a plurality of organic films and a plurality of inorganic films in an alternating manner, wherein the thin film encapsulation layer covers the organic light emitting element array and the thin film encapsulation layer is thicker in the edge region than the active region,
   wherein among the inorganic films and the organic films of the thin film encapsulation layer, only the organic films are formed to be thicker in the edge region than in the active region.

8. The method according to claim 7, wherein in the step of forming the thin film encapsulation layer, the organic films of the thin film encapsulation layer are formed by screen printing using a screen mask having a mesh corresponding to the edge region.

9. The method according to claim 8, wherein the mesh edge of the screen mask corresponds to a thicker edge region of the thin film encapsulation layer.

10. The method according to claim 8, wherein in the step of forming the thin film encapsulation layer, the screen mask is used for formation of all of the organic films of the thin film encapsulation layer.

11. The method according to claim 7, wherein in the step of forming the thin film encapsulation layer, the thin film encapsulation layer is flatly formed in the active region.

12. The method according to claim 7, wherein a diameter of a thicker region of the organic film in the edge region is 10 μm to 5000 μm.

13. The method according to claim 11, wherein after the step of forming the thin film encapsulation layer, a thickness of the thin film encapsulation layer in the edge region has a thickness 1.2 to 2 times greater than a thickness of the thin film encapsulation layer in the active region.

14. The method according to claim 7, wherein lowermost and uppermost layers of the thin film encapsulation layer are the inorganic films.

* * * * *